United States Patent
Byun

(10) Patent No.: US 8,406,080 B2
(45) Date of Patent: Mar. 26, 2013

(54) DATA OUTPUT CONTROL CIRCUIT OF A DOUBLE DATA RATE (DDR) SYNCHRONOUS SEMICONDUCTOR MEMORY DEVICE RESPONSIVE TO A DELAY LOCKED LOOP (DLL) CLOCK AND METHOD THEREOF

(75) Inventor: Hee-Jin Byun, Kyoungki-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 41 days.

(21) Appl. No.: 12/940,727

(22) Filed: Nov. 5, 2010

(65) Prior Publication Data
US 2011/0051531 A1    Mar. 3, 2011

Related U.S. Application Data

(63) Continuation of application No. 12/128,261, filed on May 28, 2008, now Pat. No. 7,852,707.

(30) Foreign Application Priority Data
Nov. 2, 2007    (KR) .................. 10-2007-0111568

(51) Int. Cl.
*G11C 7/22*    (2006.01)

(52) U.S. Cl. ......... 365/233.17; 365/233.11; 365/233.12; 365/233.13; 365/189.05; 365/193; 365/194; 326/28; 326/96; 326/95

(58) Field of Classification Search ............. 365/233.11, 365/233.12, 233.13, 233.17, 233.1, 189.05, 365/193, 194, 191; 326/28, 97, 96, 95, 98
See application file for complete search history.

(56) References Cited

U.S. PATENT DOCUMENTS
7,852,707 B2 *  12/2010  Byun ................... 365/233.17

* cited by examiner

*Primary Examiner* — Andrew Q Tran
(74) *Attorney, Agent, or Firm* — IP & T Group LLP

(57) ABSTRACT

A semiconductor memory device using system clock with a high frequency can maintain a constant operation margin even in the change of operation environments including voltage level, temperature, and process. The semiconductor memory device includes an output control signal generator configured to be responsive to a read pulse that is activated in response to a read command, to generate an odd number of first output source signals corresponding to a rising edge of a system clock and a even number of second output source signals corresponding to a falling edge of the system clock, and an output enable signal generator configured to generate a first rising enable signal and a falling enable signal on the basis of the first output source signal and generate a second rising enable signal on the basis of the second output source signal, according to column address strobe (CAS) latencies, the first rising enable signal being activated earlier than the second rising enable signal by a half cycle of the system clock.

14 Claims, 7 Drawing Sheets

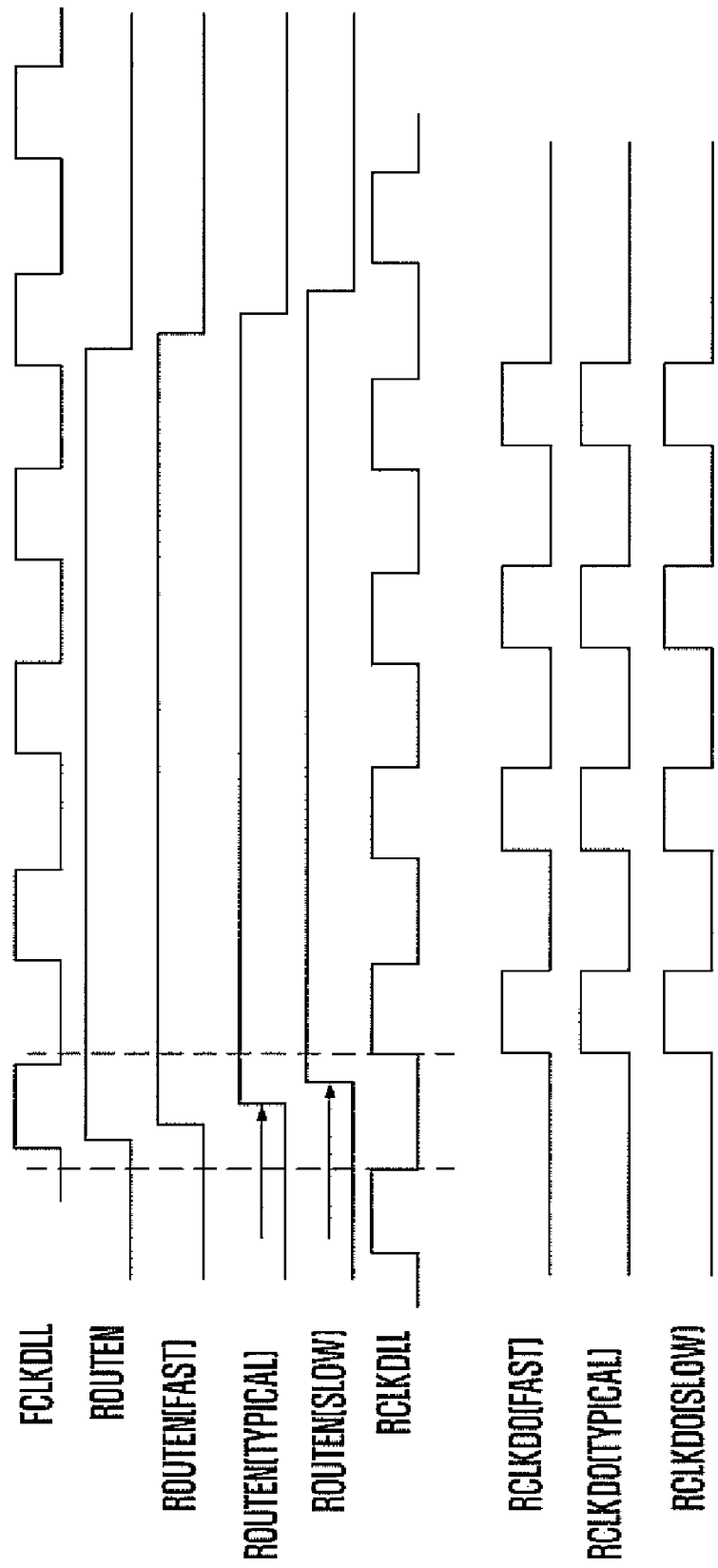

DATA OUTPUT CONTROL CIRCUIT OF A DOUBLE DATA RATE (DDR) SYNCHRONOUS SEMICONDUCTOR MEMORY DEVICE RESPONSIVE TO A DELAY LOCKED LOOP (DLL) CLOCK AND METHOD THEREOF

CROSS-REFERENCE TO RELATED APPLICATIONS

This application is a continuation of U.S. patent application Ser. No. 12/128,261 filed on May 28, 2008, now U.S. Pat. No. 7,852,707 which claims priority of Korean patent application number 10-2007-0111568 filed on Nov. 2, 2007. The disclosure of each of the foregoing applications is incorporated herein by reference in its entirety.

BACKGROUND OF THE INVENTION

The present invention relates to a semiconductor memory device, and more particularly to a delay locked loop (DLL) circuit for controlling an internal operation to output data in synchronization with a system clock when an external command is inputted to a semiconductor memory device.

In a system with a variety of semiconductor devices, a semiconductor memory device serves as data storage. The semiconductor memory device outputs data corresponding to addresses received from a data processor, e.g., a central processing unit (CPU), or stores data received from the data processor into memory cells selected by addresses.

As the operating speed of the system is increasing and semiconductor integrated circuit technologies are advanced, semiconductor memory devices are required to input and output data at higher speed. To meet this requirement, a synchronous semiconductor memory device was developed. The synchronous semiconductor memory device is designed to input or output data in synchronization with a system clock received from an outside. However, since even the synchronous semiconductor memory device could not meet the required data input/output speed, a double data rate (DDR) synchronous semiconductor memory device was developed. The DDR synchronous semiconductor memory device is designed to output or input data at falling edges and rising edges of the system clock.

The DDR synchronous semiconductor memory device must be able to process two data during one cycle of the system clock so as to input or output data at both of the falling edge and the rising edge of the system clock. Specifically, the DDR synchronous semiconductor memory device should output data exactly in synchronization with the rising edge and the falling edge of the system clock. To this end, a data output circuit of the DDR synchronous semiconductor memory device controls an internal output and transfer timing of data so as to output data in synchronization with rising and falling edges of the system clock.

In a read operation, a semiconductor memory device should output data in response to an external read command after a predetermined periods of a system clock elapse from the input of the external read command. At this point, it is a column address strobe (CAS) latency that determines a data output timing. Generally, a semiconductor memory device supports a plurality of CAS latencies that can be adjusted according to operation environments of the semiconductor memory device. The CAS latencies are stored in a mode register set (MRS) of the semiconductor memory device. When the external read command is inputted, the semiconductor memory device determines the data output timing according to the CAS latencies set in the MRS using the system clock.

The system clock inputted to the semiconductor memory device inevitably has a predetermined delay time until it arrives at a data output circuit because it passes through a clock input buffer, a transfer line, and so on. Accordingly, if the data output circuit outputs data in synchronization with the delayed system clock, an external device will receive data that are not synchronized with rising edges and falling edges of the system clock. To solve this problem, the semiconductor memory device uses a delay locked loop (DLL) circuit. The DLL circuit compensates for the delay caused by internal circuits until the system clock inputted to the semiconductor memory device is transferred to the data output circuit.

To output data exactly after a CAS latency in response to the external command, the semiconductor memory device includes a data output controller to determine a data output timing by using a DLL clock outputted from a DLL circuit and a CAS latency set in an MRS.

FIG. 1 is a block diagram of a data output control circuit of a conventional semiconductor memory device.

Referring to FIG. 1, the data output control circuit includes an output control signal generator 120, an output enable signal generator 140, delays 110A and 110B, a strobe generator 160, a driver controller 170, and a latch controller 180.

In a read operation, data outputted from a unit cell passes through a global line and is aligned in a pipeline latch. The data is applied to an output driver and is finally outputted to the outside in response to rising and falling data output signals. Since the read command is inputted, the semiconductor memory device outputs the data corresponding to the read command after the CAS latency. A data output controller is used for controlling the data output timing. The data output controller outputs an output enable signal, rising and falling data output signals RCLKD0 and FCLKD0, a latch enable signal POUT, and a driver enable signal DOUTOFF. A read detection pulse CASP6RD is activated in response to a read command, and the output enable signal is activated in response to the read detection pulse CASP6RD. The rising and falling data output signals RCLKD0 and FCLKD0 indicate data output timings corresponding to the CAS latencies. The latch enable signal POUT and the driver enable signal DOUTOFF are used for controlling the pipeline latch and the output driver that the data pass through before being outputted to the outside. In particular, since the data received form the global line is transferred to the output driver through the pipeline latch, the pipeline latch should be enabled prior to the output driver so as to completely transfer the data to the output driver. The rising and falling data output signals RCLKD0 and FCLKD0 indicating output timings of data outputted in synchronization with the rising and falling edges of the system clock CLK can also be applied to the generation of a data strobe signal (DQS).

When the output control signal generator 120 receives the read detection pulse CASP6RD indicating the input of the external read command RD, it outputs a plurality of output source signals OE2, OE25, OE3 and OE35 having phase difference corresponding to half period of the system clock. The plurality of output source signals OE2, OE25, OE3 and OE35 are used to output rising and falling enable signals ROUTEN and FOUTEN to the strobe generator 160, the driver controller 170, and the latch controller 180, based on CAS latencies CD and CIA set in the MRS. The plurality of output source signals OE2, OE25, OE3 and OE35 are selected according to the CAS latency and corresponding to each of the rising and falling edges of the system clock.

Accordingly, the number of the output source signals OE2, OE25, OE3 and OE35 is two times the number of the CAS latencies (CL3 and CL4, in this example)

The latch controller 180 outputs the latch enable signal POUT in response to the rising and falling enable signals ROUTEN and FOUTEN and the DLL clocks RCLKDLL and FCLKDLL outputted from the DLL circuit. The latch enable signal POUT enables the data output of the pipe line latch, which is a stage prior to the data output driver. In addition, in response to the rising and falling enable signals ROUTEN and FOUTEN and the DLL clocks RCLKDLL and FCLKDLL, the driver controller 170 outputs the driver enable signal DOUTOFF for controlling a timing when data is outputted from the data output driver, and the strobe generator 160 outputs the rising and falling data output signals RCLKD0 and FCLKD0 for controlling a timing when data is finally outputted through a data pad. In order to sequentially transfer data to be outputted to the outside, the latch enable signal POUT should be activated one cycle of the system clock earlier than the CAS latency CL, and the driver enable signal DOUTOFF and the rising and falling data output signals RCLKD0 and FCLKD0 should be activated half the cycle of the system clock earlier than the CAS latency CL. Due to the different activation timing of the signals, the rising and falling enable signals ROUTEN and FOUTEN are delayed through the delays 110A and 110B by a predetermined time and then are applied to the strobe generator 160 and the driver controller 170.

That is, in order to output data after the CAS latency in response to the external read command, the latch enable signal POUT, the driver enable signal DOUTOFF, and the rising and falling data output signals RCLKD0 and FCLKD0 must be able to exactly activated in sequence at a preset timing. To this end, as illustrated in FIG. 1, the conventional semiconductor memory device is configured to control the activation timings of the signals by using the delays 110A and 1108.

FIG. 2A is a circuit diagram of the output enable signal generator 140 illustrated in FIG. 1.

Referring to FIG. 2A, the output enable signal generator 140 includes a rising signal generating unit 142 and a falling signal generating unit 144. Each of the rising signal generating unit 142 and the falling signal generating unit 144 is implemented with transfer gates and a plurality of inverters.

Upon operation of the output enable signal generator 140, the rising signal generating unit 142 receives the plurality of output source signals OE2 and OE3 activated in synchronized with rising edges of a system clock, and selectively transfers them according to the CAS latencies CL3 and CL4. In a similar manner, the falling signal generating unit 144 receives the plurality of output source signals OE25 and OE35 activated in synchronization with falling edges of the system clock, and selectively transfers them according to the CAS latencies CL3 and CL4.

FIG. 2B is a circuit diagram of the strobe generator 160 illustrated in FIG. 1.

Referring to FIG. 2B, the strobe generator 160 includes a rising strobe generating unit 162 configured to generate the rising data output signal RCLKD0 in synchronization with the rising edge of the system clock. Although not shown, the strobe generator 160 also includes a falling strobe generating unit configured to generate the falling data output signal FCLKD0 in synchronization with the falling edge of the system clock. Specifically, the rising strobe generating unit 162 includes a NAND gate and an inverter.

The strobe generator 160 performs an AND operation on a delayed rising enable signal ROUTEND by the delay 110A and the DLL clock RCLKDLL to output the rising data output signal RCLKD0 corresponding to the rising edge of the system clock. Although not shown, the strobe generator 160 performs an AND operation on a delayed falling enable signal FOUTEND by the delay 110A and the DLL clock FCLKDLL to output the falling data output signal FCLKD0 corresponding to the falling edge of the system clock.

FIG. 3 is a timing diagram illustrating the operation of the data output control circuit of FIG. 1.

As illustrated in FIG. 3, in order to generate the rising data output signal RCLKD0 for normal data output, the delayed rising enable signal ROUTEND outputted from the delay 110A should be activated prior to the rising edge of the DLL clock RCLKDLL corresponding to the data output timing. That is, the activation timing of the delayed rising enable signal ROUTEND should be in a logic low period (deactivation period) defined prior to the rising edge of the DLL clock RCLKDLL. This is because the activation period ranging from the rising edge to the falling edge of the DLL clock RCLKDLL may be the activation period of the rising data output signal RCLKD0 and the data can be normally outputted.

If the phase of the delayed rising enable signal ROUTEND outputted from the delay 110A is adjusted to start from the center of the logic low period of the DLL clock RCLKDLL, the operation margin corresponding to ¼ period of the system clock can be obtained. Thus, it does not matter when the semiconductor memory device uses a system clock with a low frequency. However, due to the change of operation environments of the semiconductor memory device, such as voltage level, temperature, and process, the delay amount of the delays 110A and 110B using a plurality of delay elements may be changed.

Furthermore, when the semiconductor memory device uses a system clock with a high frequency, the operation margin corresponding to ¼ period of the system clock may be insufficient. Referring to FIG. 3, when the delay amount of the delay 110A is not typical, that is, when the delay amount of the delays 110A and 110B decreases (a FAST case), or the delay amount of the delays 110A and 110B increases (a SLOW case), the activation period of the rising data output signal RCLKD0 is not normally ensured. In this case, the valid window of data outputted in synchronization with the rising data output signal RCLKD0 is also reduced and it is uncertain whether data is normally outputted, thus degrading the operation reliability of the semiconductor memory device.

SUMMARY OF THE INVENTION

Embodiments of the present invention are directed to providing a semiconductor memory device using system clock with a high frequency, which can maintain a constant operation margin even in the change of operation environments including voltage level, temperature, and process.

In accordance with an aspect of the present invention, there is provided a data output control circuit, including an output control signal generator configured to be responsive to a read command to output a plurality of output source signals corresponding to rising and falling edges of a system clock, an output enable signal generator configured to generate a first rising enable signal and a falling enable signal on the basis of the plurality of output source signals corresponding to the rising edge of the system clock, and to generate a second rising enable signal on the basis of the plurality of output source signals corresponding to the falling edge of the system clock, a latch controller configured to enable a pipeline latch in response to the first rising enable signal and a delay locked loop (DLL) clock, a driver controller configured to enable a data output driver in response to the second rising enable signal, the falling enable signal and the DLL clock, and a strobe generator configured to output rising and falling data output signals in response to the second rising enable signal, the falling enable signal and the DLL clock.

In accordance with another aspect of the present invention, there is provided a semiconductor memory device, including a data output control circuit configured to control data outputted in synchronization with a falling edge of a system clock using a first output source signal corresponding to a rising edge of the system clock, and to control data outputted in synchronization with the rising edge of the system clock using a second output source signal corresponding to a falling edge of the system clock, and a data output circuit configured to output data, the data output circuit being controlled by the data output control circuit.

In accordance with further aspect of the present invention, there is provided a semiconductor memory device, including an output control signal generator configured to be responsive to a read pulse that is activated in response to a read command, to generate an odd number of first output source signals corresponding to a rising edge of a system clock and a even number of second output source signals corresponding to a falling edge of the system clock, and an output enable signal generator configured to generate a first rising enable signal and a falling enable signal on the basis of the first output source signal and generate a second rising enable signal on the basis of the second output source signal, according to column address strobe (CAS) latencies, the first rising enable signal being activated earlier than the second rising enable signal by a half cycle of the system clock.

In accordance with further aspect of the present invention, there is provided a method of operating a semiconductor memory device, the method including controlling data outputted in synchronization with a falling edge of a system clock using a first output source signal corresponding to a rising edge of the system clock, and data outputted in synchronization with the rising edge of the system clock using a second output source signal corresponding to the falling edge of the system clock.

BRIEF DESCRIPTION OF THE DRAWINGS

FIG. 6 is a timing diagram illustrating an operation of the data output control circuit in FIG. 4.

DESCRIPTION OF SPECIFIC EMBODIMENTS

Hereinafter, a semiconductor memory device in accordance with the present invention will be described in detail with reference to the accompanying drawings.

The semiconductor memory device of the present invention may include a data output control circuit configured to control data outputted in synchronization with a falling edge of a system clock using a first output source signal synchronized with a rising edge of the system clock, and to control data outputted in synchronization with the rising edge of the system clock using a second output source signal synchronized with a falling edge of the system clock, and a data output circuit (not shown) configured to output data received from the inside to the outside, the data output circuit being controlled by the data output control circuit. Herein, data output circuit may include a pipeline latch configured to temporarily store data for aligning the data outputted from a plurality of unit cells, and an output driver configured to output the data transferred from the pipeline latch to the outside. The description for data output circuit including the pipeline latch and the output driver has been fully made already in the conventional art, and thus further details are omitted herein. The data output control circuit will be mainly described in detail hereinafter.

Figure 4:
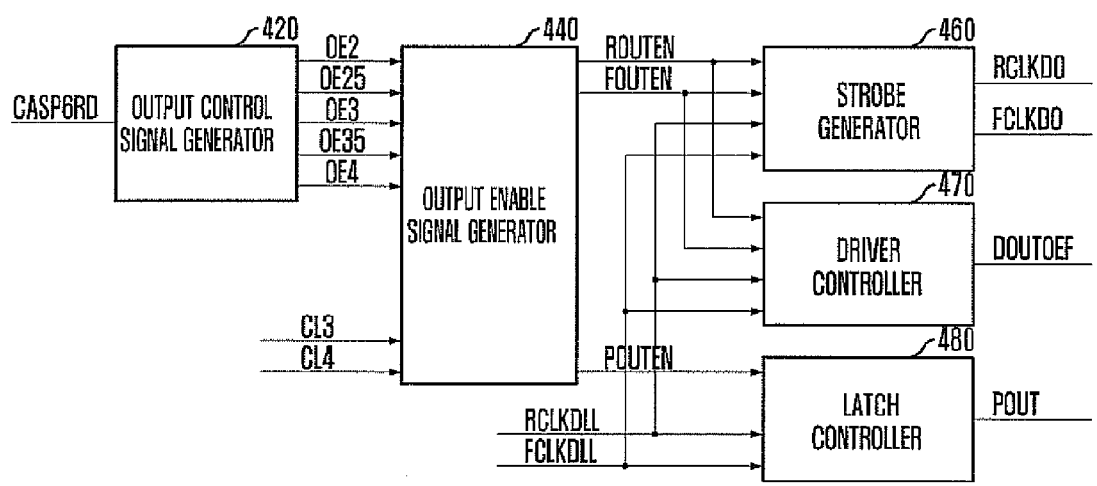
FIG. 4 is a block diagram of a data output control circuit of a semiconductor memory device in accordance with an embodiment of the present invention.

FIG. 4 is a block diagram of a data output control circuit of a semiconductor memory device in accordance with an embodiment of the present invention.

Referring to FIG. 4, the data output control circuit includes an output control signal generator 420, an output enable signal generator 440, a strobe generator 460, a driver controller 470, and a latch controller 480. The output control signal generator 420 is responsive to a read command to output a plurality of output source signals OE2, OE25, OE3, OE35 and OE4 corresponding to rising and falling edges of a system clock. The output enable signal generator 440 generates a first rising enable signal POUTEN and a falling enable signal FOUTEN on the basis of the output source signals corresponding to the rising edge of the system clock, and generates a second rising enable signal ROUTEN on the basis of the output source signals corresponding to the falling edge of the system clock. The latch controller 480 outputs a latch enable signal POUT for enabling a pipeline latch in response to the first rising enable signal POUTEN and delay locked loop (DLL) clocks RCLKDLL and FCLKDLL. The driver controller 470 outputs a drive enable signal DOUTOFF, which enables a data output driver, in response to the second rising enable signal ROUTEN, the falling enable signal FOUTEN and the DLL clocks RCLKDLL and FCLKDLL. The strobe generator 460 outputs rising and falling data output signals RCLKD0 and FCLKD0 in response to the second rising enable signal ROUTEN, the falling enable signal FOUTEN and the DLL clocks RCLKDLL and FCLKDLL.

Here, the rising and falling data output signals RCLKD0 and FCLKD0 indicates output timings of data outputted in synchronization with the rising and falling edges of the system clock CLK and are also used to generate a data strobe signal (DQS). Among the plurality of output source signals OE2, OE25, OE3, OE35 and OE4, the output source signals OE2, OE3 and OE4 (hereinafter, referred to as 'first output source signals') corresponds to the rising edge of the system clock, and the output source signals OE25 and OE35 (hereinafter, referred to as 'second output source signals') corresponds to the falling edge of the system clock. In the semiconductor memory device in accordance with the present invention, the number of the first source signals OE2, OE3 and OE4 is odd and one greater than that of the second output source signals OE25 and OE35. That is, the semiconductor memory device of the present invention generates the output source signals OE2, OE25, OE3, OE35 and OE4 of which number is one greater than two times the number of the CAS latencies CL3 and CL4, which significantly differs from the conventional semiconductor memory device.

The DLL clocks RCLKDLL and FCLKDLL, which are outputted from a DLL circuit (not shown) for determining a data output timing by compensating for delay amount occurring while the system clock is transferred inside the semiconductor memory device, may be divided into two kinds of clocks. One of the DLL clocks is a rising DLL clock RCLKDLL synchronized with the rising edge of the system clock, and the other is a falling DLL clock FCLKDLL synchronized with a falling edge of the system clock.

The output enable signal generator 440 receives CAS latencies CL3 and CL4 which are set in a mode register set (MRS), and activates the first rising enable signal POUTEN earlier than the second rising enable signal ROUTEN by half the cycle of the system clock and earlier than the falling enable signal FOUTEN by one cycle of the system clock according to the CAS latencies CL3 and CL4. In semiconductor memory device of the present invention, the second rising enable signal ROUTEN and the falling enable signal FOUTEN is used for generating the rising and falling data output signals RCLKD0 and FCLKD0 and the driver enable signal DOUTOFF. The latch enable signal POUT is generated by the use of the first rising enable signal POUTEN.

Therefore, the latch enable signal POUT can be activated earlier than the rising and falling data output signals RCLKD0 and FCLKD0 and the driver enable signal DOUTOFF by half the cycle of the system clock. Further, the semiconductor memory device of the present invention generates the falling data output signal FCLKD0 using the first output source signals OE3 and OE4 corresponding to the rising edge of the system clock, and the rising data output signal RCLKD0 using the second output source signals OE25 and OE35 corresponding to the falling edge of the system clock.

Figure 1:
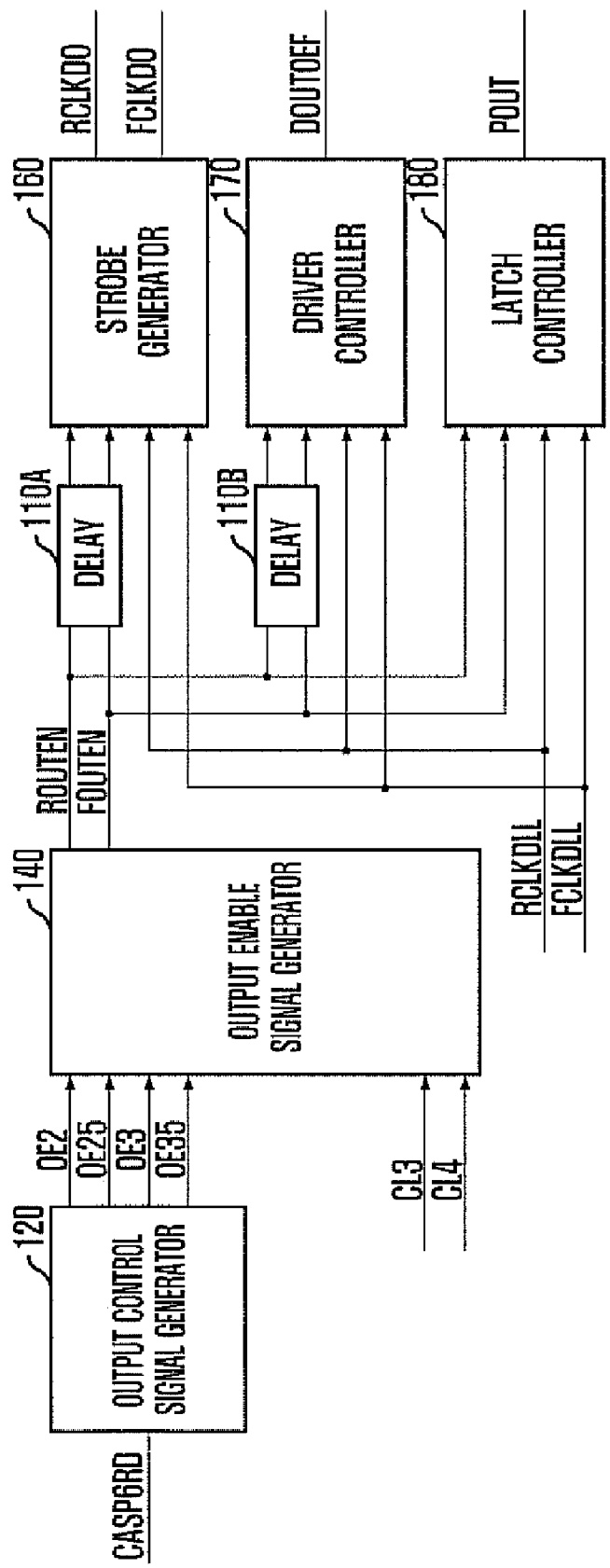
FIG. 1 is a block diagram of a data output control circuit of a conventional semiconductor memory device.
Figure 2A:
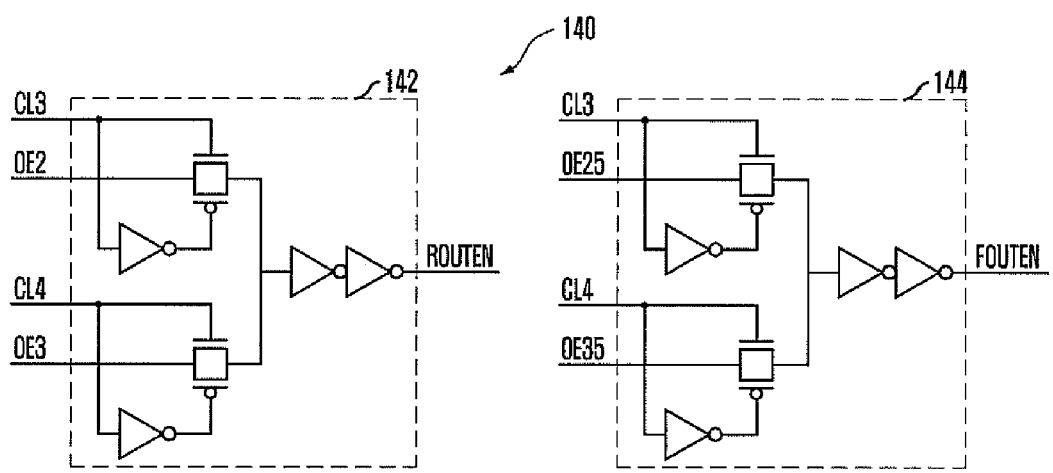
FIG. 2A is a circuit diagram of an output enable signal generator in FIG. 1.
Figure 2B:
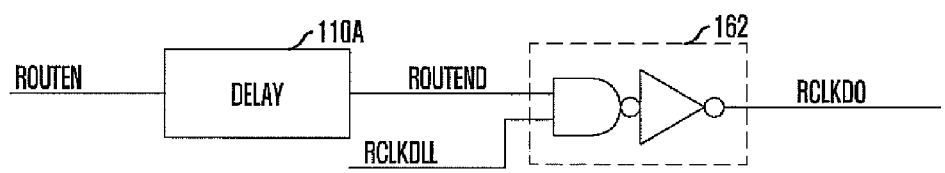
FIG. 2B is a circuit diagram of a strobe generator in FIG. 1.
Figure 3:
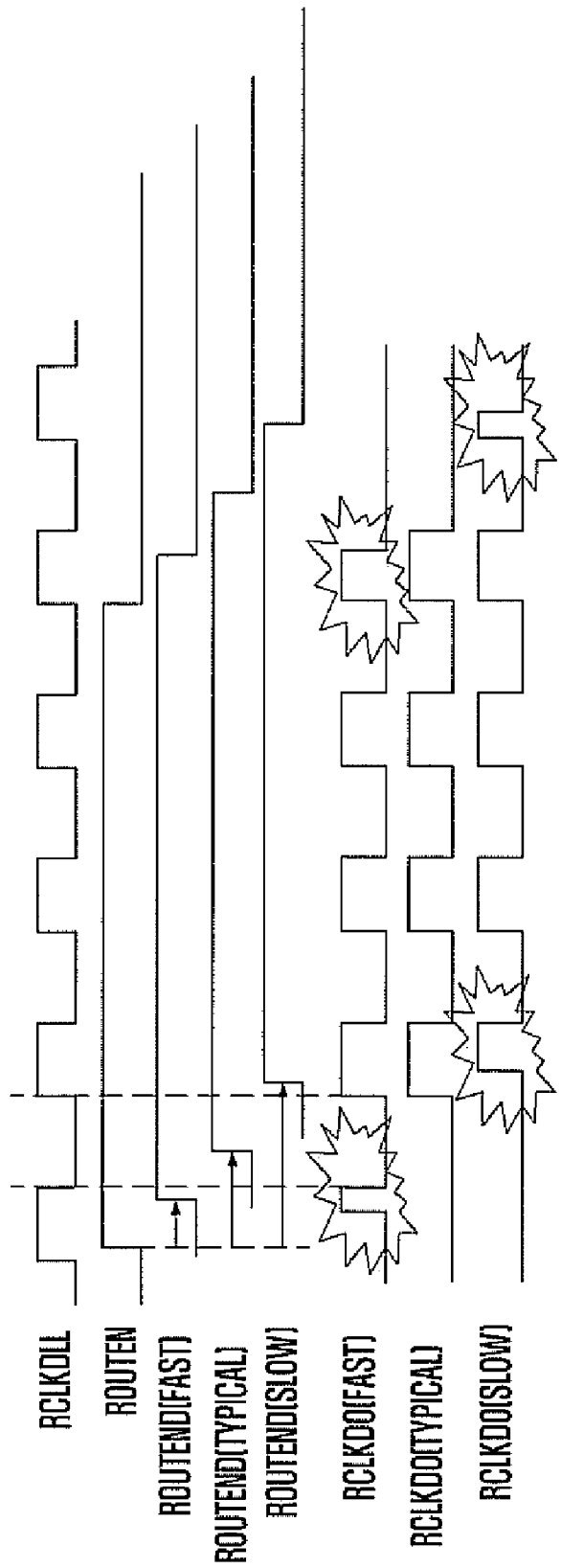
FIG. 3 is a timing diagram illustrating an operation of the data output control circuit in FIG. 1.

In this way, the output timing of data outputted in synchronization with the rising and falling edges of the system clock can be controlled at an interval corresponding to half the cycle of the system clock. Furthermore, an operation margin required for transferring data from the pipeline latch to the output driver can also be maintained at the half the cycle of the system clock. Therefore, it is possible to secure an operation margin without the additional delay unit (see 110A and 110B of FIG. 1) which was conventionally used to secure the operation margin for transferring data from the pipeline latch to the output driver. In addition, it is possible to prevent malfunction caused by a delay amount variation of the delay unit due to a change in operation conditions of the semiconductor memory device. Particularly, the first rising enable signal POUTEN, the second rising enable signal ROUTEN and the falling enable signal FOUTEN, which do not pass through separate delay components, can minimize the effect of skew caused by process variation.

Figure 5A:
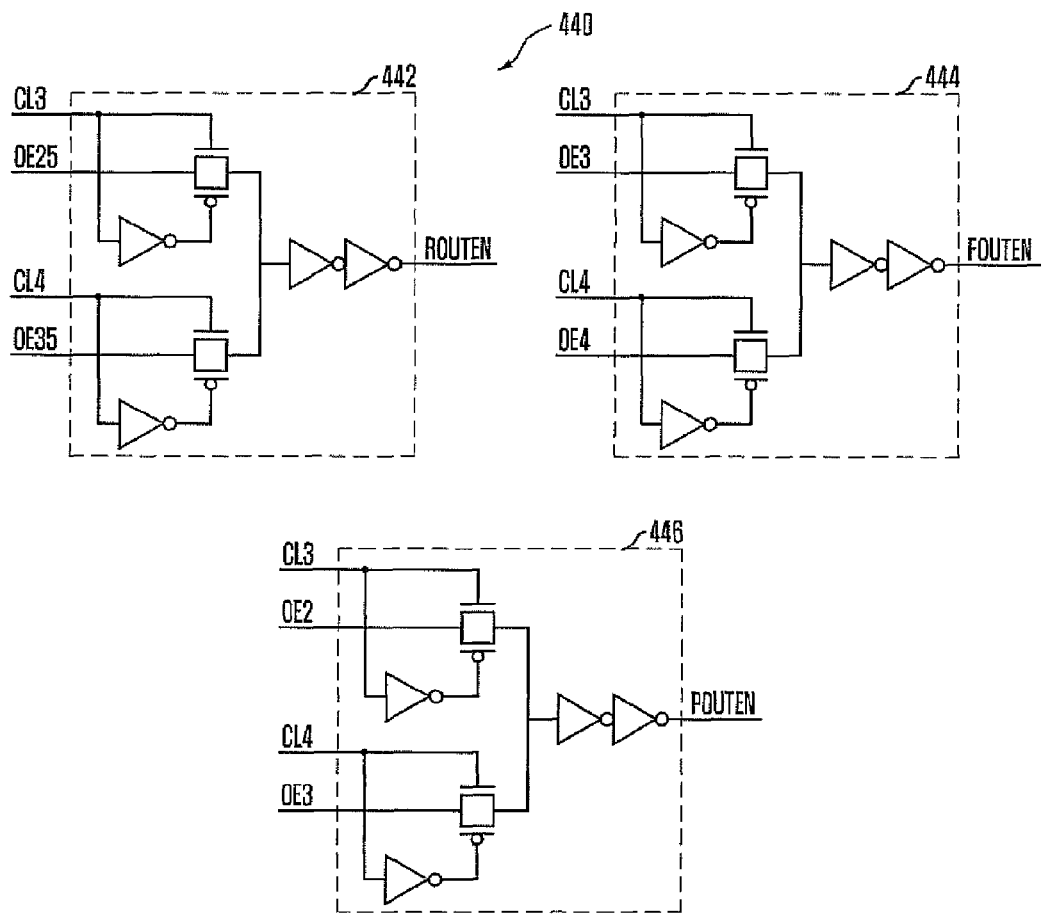
FIG. 5A is a circuit diagram of an output enable signal generator in FIG. 4.

FIG. 5A is a circuit diagram of the output enable signal generator 440 in FIG. 4.

Referring to FIG. 5A, the output enable signal generator 440 selectively outputs the plurality of output source signals OE2, OE25, OE3, OE35 and OE4 according to the CAS latencies CL3 and CL4 so as to generate the first rising enable signal POUTEN, the second rising enable signal ROUTEN or the falling enable signal FOUTEN.

Specifically, the output enable signal generator 440 includes a first rising signal generating unit 446, a second rising signal generating unit 442 and a falling signal generating unit 444. The first rising signal generating unit 446 selectively outputs first rising source signals OE2 and OE3 of the first output source signals OE2, OE3 and OE4 as the first rising enable signal POUTEN according to the CAS latencies CL3 and CL4. The second rising signal generating unit 442 outputs one of the second output source signals OE25 and OE35 as the second rising enable signal ROUTEN according to the CAS latencies CL3 and CL4. The falling signal generating unit 444 selectively outputs second rising source signals OE3 and OE4 of the first output source signals OE2, OE3 and OE4 as the falling enable signal ROUTEN according to the CAS latencies CL3 and CL4. Resultantly, the first rising enable signal POUTEN using the first rising source signals OE2 and OE3 are activated earlier than falling enable signal FOUTEN using the second rising source signals OE3 and OE4 by one cycle of the system clock in case of the same CAS latencies CL3 and CL4.

As illustrated in FIG. 5A, the first rising signal generating unit 446, the second rising signal generating unit 442 and the falling signal generating unit 444 have the same configuration. For instance, the second rising signal generating unit 442 includes a plurality of transfer gates configured to transfer the second output source signals OE25 and OE35 according to the CAS latencies CL3 and CL4, and even number of inverters configured to buffer an output signal of the transfer gate to output the second rising enable signal ROUTEN.

Figure 5B:
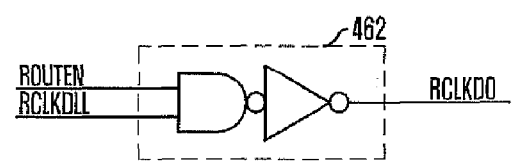
FIG. 5B is a circuit diagram of a strobe generator in FIG. 4.

FIG. 5B is a circuit diagram of the strobe generator 460 in FIG. 4.

Referring to FIG. 5B, the strobe generator 460 includes a rising strobe generating unit 462 configured to generate the rising data output signal RCLKD0 corresponding to the rising clock of the system clock. Although not shown, the strobe generator 460 also includes a falling strobe generating unit configured to generate the falling data output signal FCLKD0 corresponding to the falling clock of the system clock. Specifically, the rising strobe generating unit 462 includes a NAND gate configured to perform a logic NAND operation on the second rising enable signal ROUTEN and the rising DLL clock RCLKDLL, and an inverter configured to invert an output of the NAND gate.

FIG. 6 is a timing diagram illustrating operation of the data output control circuit in FIG. 4.

Referring to FIG. 6, even in the TYPICAL case, i.e., a condition where signals are transferred normally, in the FAST case, i.e., a condition where signals are transferred fast, or in the SLOW case, i.e., a condition where signals are transferred slowly, malfunction may not take place exceeding ¼ period of the system clock in the semiconductor memory device of the present invention, because each case occurs by small delay amount due to a signal loading. Therefore, in order that the second rising enable signal ROUTEN may be activated earlier than the rising DLL clock RCLKDLL corresponding to a data output timing, the semiconductor memory device of the present invention is designed such that a rising edge of the second rising enable signal ROUTEN is positioned in the center of a logic low level period, i.e., deactivation period, prior to the rising edge of the rising DLL clock RCLKDLL. Consequently, it is easy to secure the operation margin for generating the rising data output signal RCLKD0 even in an environment using the system clock with a high frequency.

Figure 7A:
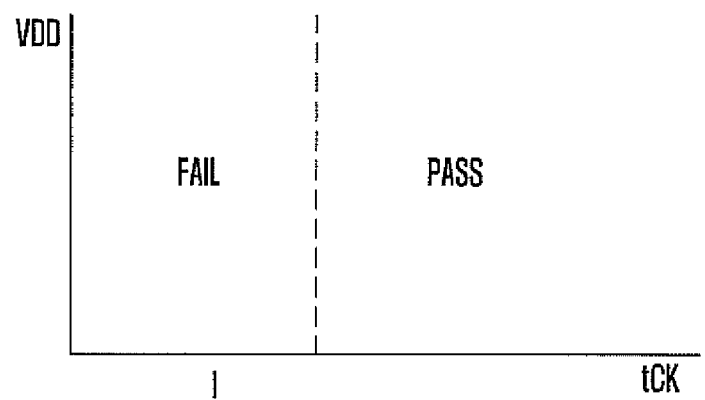
FIGS. 7A and 7B are graphs comparing an operation margin of the data output control circuit of FIG. 4 with that of a conventional data output control circuit.
Figure 7B:
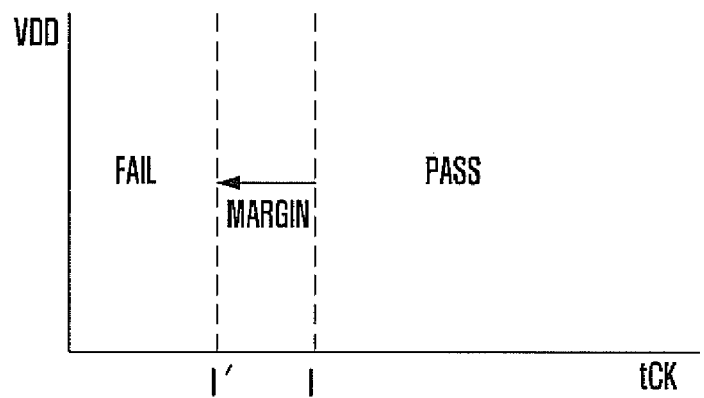

FIGS. 7A and 7B are graphs comparing an operation margin of the data output control circuit of FIG. 4 with that of a conventional data output control circuit. Specifically, FIG. 7A illustrates a wide malfunction range due to skew in a conventional semiconductor memory device, and FIG. 7B illustrates a small malfunction range in the semiconductor memory device of the present invention.

Referring to FIGS. 7A and 7B, the semiconductor memory device of the present invention easily secure the operation margin described in FIG. 6, thus preventing the malfunction even if a skew occurs due to process. Also, it can be observed that the malfunction range is reduced in the semiconductor memory device of the present invention compared to the conventional semiconductor memory device.

In order to control an output timing of data corresponding to an inputted read command, a semiconductor memory device in accordance with the present invention maintain a constant operation margin even in the change of operation environments, thus outputting the data steadily. Instead of using separate delay units, which are conventionally used to control an activation timing of control signals outputted from a data output control circuit but have difficult in constantly maintaining delay amount in the change of operation environments, the semiconductor memory device generates a signal corresponding to a raising edge of a system clock by using a signal corresponding to a falling edge of the system clock. It makes the control signals outputted from the data output control circuit activated in sequence.

In accordance with an embodiment of present invention, a semiconductor memory device is provided with a data output control unit capable of constantly maintaining an operation margin even in the change of operation environments including voltage level, temperature, and process. The semiconductor memory device can increase the operation reliability in environments using a system clock with a high frequency.

In addition, compared with a prior art, the data output control unit can be easily implemented to achieve an optimal operation through a simple design change. Without a plurality of delay units, it may increase the integration density and reduce the power consumption of the semiconductor memory device.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
a data output control circuit configured to control data to be outputted in synchronization with a falling edge of a system clock by generating a first rising enable signal and a falling enable signal based on a first output source signal corresponding to a rising edge of the system clock, and to control data to be outputted in synchronization with the rising edge of the system clock by generating a second rising enable signal based on a second output source signal corresponding to the falling edge of the system clock, wherein the falling enable signal and the second rising enable signal are not delayed by a delay circuit; and
a data output circuit configured to output data, the data output circuit being controlled by the data output control circuit.

2. The semiconductor memory device of claim 1, wherein the data output control circuit includes:
an output control signal generator configured to be responsive to a read command to output the first and second output source signals;
an output enable signal generator configured to generate the first rising enable signal and the falling enable signal on the basis of the first output source signal and to generate the second rising enable signal on the basis of the second output source signal, according to column address strobe (CAS) latencies; and
a control signal output unit configured to generate a control signal for controlling the data output circuit in response to the first rising enable signal, the second rising enable signal and the falling enable signal.

3. The semiconductor memory device of claim 2, wherein the data output circuit includes:
a pipeline latch configured to temporarily store data for aligning the data outputted from a plurality of unit cells; and
an output driver configured to output the data transferred from the pipeline latch to the outside of the semiconductor memory device.

4. The semiconductor memory device of claim 3, wherein the control signal output unit includes:
a latch controller configured to enable a pipeline latch in response to the first rising enable signal and a delay locked loop (DLL) clock;
a driver controller configured to enable a data output driver in response to the second rising enable signal, the falling enable signal and the DLL clock; and
a strobe generator configured to output rising and falling data output signals in response to the second rising enable signal, the falling enable signal and the DLL clock.

5. The semiconductor memory device of claim 4, wherein the first rising enable signal is activated earlier than the second rising enable signal by a half cycle of the system clock, and earlier than the falling enable signal by one cycle of the system clock.

6. The semiconductor memory device of claim 2, wherein the output control signal generator generates odd number of first output source signals corresponding to the rising edge of the system clock and even number of second output source signals corresponding to the falling edge of the system clock.

7. The semiconductor memory device of claim 2, wherein the output enable signal generator generates the falling enable signal on the basis of the first output source signal later than the first rising enable signal by one cycle of the system clock, according to the CAS latencies.

8. The semiconductor memory device of claim 2, wherein the output enable signal generator includes:
a first rising signal generating unit configured to output one of first rising source signals of the first output source signals as the first rising enable signal according to the CAS latencies;
a second rising signal generating unit configured to output one of the second output source signals as the second rising enable signal according to the CAS latencies; and
a falling signal generating unit configured to output one of second rising source signals of the first output source signals as the falling enable signal according to the CAS latencies,
the first rising source signal being activated earlier than the second rising source signal by one cycle of the system clock.

9. The semiconductor memory device of claim 8, wherein the second rising signal generating unit includes:
a plurality of transfer gates configured to transfer the second output source signals according to the CAS latencies; and
an even number of inverters configured to buffer output signals of the transfer gates.

10. A method of operating a semiconductor memory device, comprising:
controlling data to be outputted in synchronization with a falling edge of a system clock by generating a first rising enable signal and a falling enable signal based on a first output source signal corresponding to a rising edge of the system clock; and
controlling data to be outputted in synchronization with the rising edge of the system clock by generating a second rising enable signal based on a second output source signal corresponding to the falling edge of the system clock, wherein the falling enable signal and the second rising enable signal are not delayed by a delay circuit.

11. The method of claim 10, wherein the controlling of the data includes:

generating the first rising enable signal and the falling enable signal on the basis of the first output source signal according to column address strobe (CAS) latencies;

generating the second rising enable signal on the basis of the second output source signal according to the CAS latencies; and controlling a data output timing in response to the first rising enable signal, the second rising enable signal and the falling enable signal.

12. The method of claim 11, wherein the controlling of the data output timing includes:

generating a pipeline latch signal in response to the first rising enable signal;

generating an output driver signal in response to the second rising enable signal, the falling enable signal and a delay locked loop (DLL) clock; and generating rising and falling data output signals in response to the second rising enable signal, the falling enable signal and the DLL clock.

13. The method of claim 11, wherein the first rising enable signal is activated earlier than the second rising enable signal by a half cycle of the system clock, and earlier than the falling enable signal by one cycle of the system clock.

14. The method of claim 10, further comprising outputting the first and second output source signals in response to a read command.

* * * * *